(12) United States Patent
Chang et al.

(10) Patent No.: US 9,082,841 B1
(45) Date of Patent: Jul. 14, 2015

(54) SEMICONDUCTOR DEVICE HAVING METAL LAYER OVER DRIFT REGION

(71) Applicant: Macronix International Co., Ltd, Hsinchu (TW)

(72) Inventors: Yu-Jui Chang, Hsinchu (TW); Cheng-Chi Lin, Toucheng Township (TW); Shih-Chin Lien, New Taipei (TW); Shyi-Yuan Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/296,268

(22) Filed: Jun. 4, 2014

(51) Int. Cl.
| | |
|---|---|
| *H01L 29/76* | (2006.01) |
| *H01L 29/94* | (2006.01) |
| *H01L 29/78* | (2006.01) |

(52) U.S. Cl.
CPC ........................................ *H01L 29/78* (2013.01)

(58) Field of Classification Search
CPC ........................... H01L 29/0634; H01L 29/78

USPC .................................. 257/339, 342; 438/270
See application file for complete search history.

(56) References Cited

U.S. PATENT DOCUMENTS

| | | | |
|---|---|---|---|
| 2006/0033156 A1* | 2/2006 | Huang et al. | 257/335 |
| 2010/0006935 A1* | 1/2010 | Huang et al. | 257/341 |

* cited by examiner

*Primary Examiner* — Theresa T Doan
(74) *Attorney, Agent, or Firm* — Finnegan, Henderson, Farabow, Garrett & Dunner LLP

(57) ABSTRACT

A semiconductor device includes a substrate, an insulation layer disposed over the substrate, covering a drift region, and including a first edge and a second edge opposite to the first edge, a gate layer covering the first edge of the insulation layer, and a metal layer including a metal portion connected to the gate layer and overlapping the first edge of the insulation layer. The metal portion includes a first edge located closer to a central portion of the insulation layer than an opposite second edge of the metal portion. A distance from the first edge of the metal portion to the first edge of the insulation layer along a channel length direction is a. A distance from the first edge of the insulation layer to the second edge of the insulation layer is L. A ratio of a/L is equal to or higher than 0.46.

20 Claims, 4 Drawing Sheets

SEMICONDUCTOR DEVICE HAVING METAL LAYER OVER DRIFT REGION

FIELD OF THE DISCLOSURE

The present disclosure relates to a semiconductor device and, more particularly, to a semiconductor device having a metal layer over a drift region.

BACKGROUND OF THE DISCLOSURE

Ultra-high voltage semiconductor devices are widely used in display devices, portable devices, and many other applications. Design goals of the ultra-high voltage semiconductor devices include high breakdown voltage, low specific on-resistance, and high reliability in both room temperature and high temperature environments. However, as the dimensions of ultra-high voltage semiconductor devices scale down, it becomes challenging to achieve these design goals.

SUMMARY

According to an embodiment of the disclosure, a semiconductor device includes a substrate, a drift region disposed in the substrate, an insulation layer disposed over the substrate and covering the drift region, the insulation layer including a first edge and a second edge opposite to the first edge, a gate layer disposed over the substrate and covering the first edge of the insulation layer, and a metal layer disposed over the substrate and the insulation layer, the metal layer including a metal portion connected to the gate layer and overlapping the first edge of the insulation layer. The metal portion includes a first edge located closer to a central portion of the insulation layer than an opposite second edge of the metal portion. A distance from the first edge of the metal portion to the first edge of the insulation layer along a channel length direction is a. A distance from the first edge of the insulation layer to the second edge of the insulation layer is L. A ratio of a/L is equal to or higher than 0.46.

According to another embodiment of the disclosure, a semiconductor device includes a substrate, a drift region disposed in the substrate, an insulation layer disposed over the substrate and covering the drift region, the insulation layer including a first edge and a second edge opposite to the first edge, a gate layer disposed over the substrate and covering the first edge of the insulation layer, and a metal layer disposed over the substrate and the insulation layer, the metal layer including a metal portion connectable to receive a boot voltage and overlapping the insulation layer. The metal portion includes a first edge located closer to the central portion of the insulation layer than an opposite second edge of the metal portion. A distance from the first edge of the metal portion to the second edge of the insulation layer along the channel length direction is b. A distance from the first edge of the insulation layer to the second edge of the insulation layer is L. A ratio of b/L is equal to or lower than 0.3.

According to a further embodiment of the disclosure, an integrated circuit includes a substrate including a high side operating region, a low side operating region, and an ultra-high voltage metal-oxide-semiconductor region disposed between the high side operating region and the low side operating region, a drift region disposed in the ultra-high voltage metal-oxide-semiconductor region of the substrate, an insulation layer disposed over the substrate and covering the drift region, the insulation layer including a first edge and a second edge opposite to the first edge, a gate layer disposed over the substrate and covering the first edge of the insulation layer, and a metal layer disposed over the substrate and the insulation layer, the metal layer including a metal portion connected to the gate layer and overlapping the first edge of the insulation layer. The metal portion includes a first edge located closer to a central portion of the insulation layer than an opposite second edge of the metal portion. A distance from the first edge of the metal portion to the first edge of the insulation layer along a channel length direction is a. A distance from the first edge of the insulation layer to the second edge of the insulation layer is L. A ratio of a/L is equal to or higher than 0.46.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
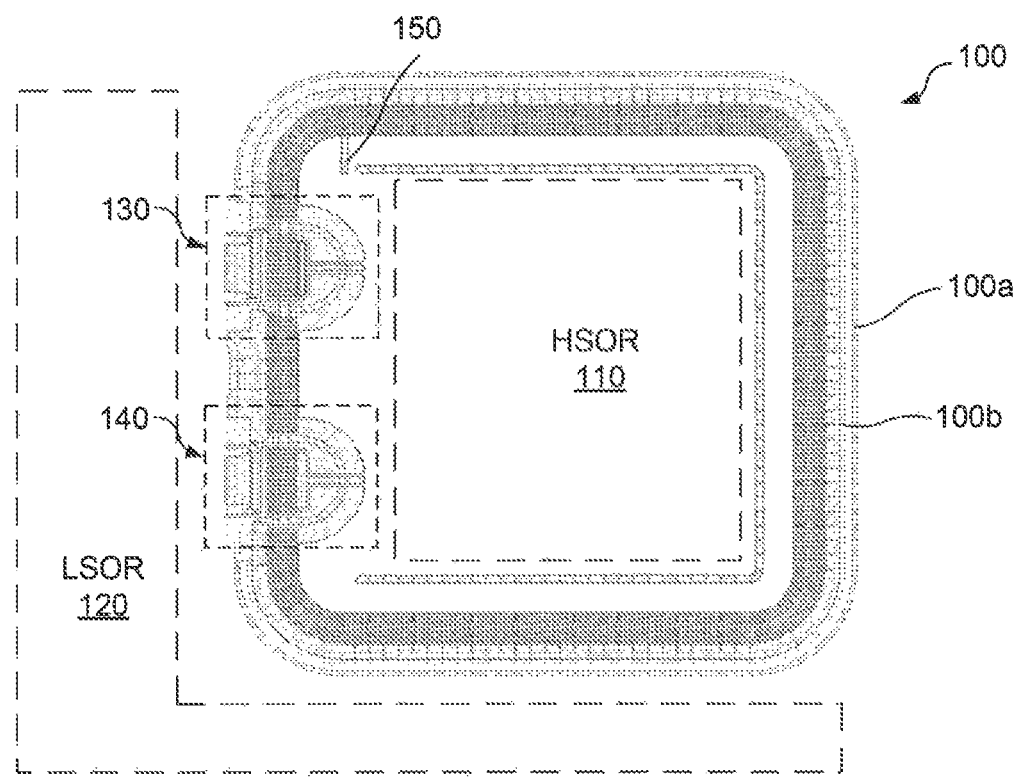
FIG. 1 is a top view of an integrated circuit having ultra-high voltage metal-oxide-semiconductor (UHV MOS) devices according an embodiment of the present disclosure.

FIG. 1 is a top view of an integrated circuit (IC) 100 having ultra-high voltage metal-oxide-semiconductor (UHV MOS) devices according to an embodiment of the present disclosure. As illustrated in FIG. 1, IC 100 is formed on a substrate having two wells 100a and 100b. The substrate includes a high voltage side operating region (HSOR) 110 inside an area surrounded by two wells 100a and 100b, and a low voltage side operating region (LSOR) 120 at the left side and the lower side of the area surrounded by two wells 100a and 100b. IC 100 includes two UHV MOS devices 130 and 140 located between HSOR 110 and LSOR 120. UHV MOS devices 130 and 140 are similarly structure, but can have different operating voltages, such as gate voltages, source voltages, drain voltages, and bulk voltages. Both UHV MOS devices 130 and 140 have relatively high breakdown voltages of higher than 500 V. Although FIG. 1 only illustrates two UHV MOS devices 130 and 140, additional semiconductor devices such as low-voltage metal-oxide-semiconductor (LV-MOS) devices, bipolar junction transistors (BJTs), capacitors, resistors, etc., may be formed in HSOR 110. The semiconductor devices formed in HSOR 110 are connected to a ground voltage of higher than 500 V. Similarly, additional semiconductor devices such as LVMOS devices, BJTs, capacitors, resistors, etc., may be formed in LSOR 120. The semiconductor devices formed in LSOR 120 are connected to a ground voltage of about 0 V. Ground voltage as used therein refers to a reference voltage. IC 100 also includes a metal layer 150 that surrounds HSOR 110. During operation of IC 100, a boot voltage $V_B$ is applied to metal layer 150.

Figure 2A:
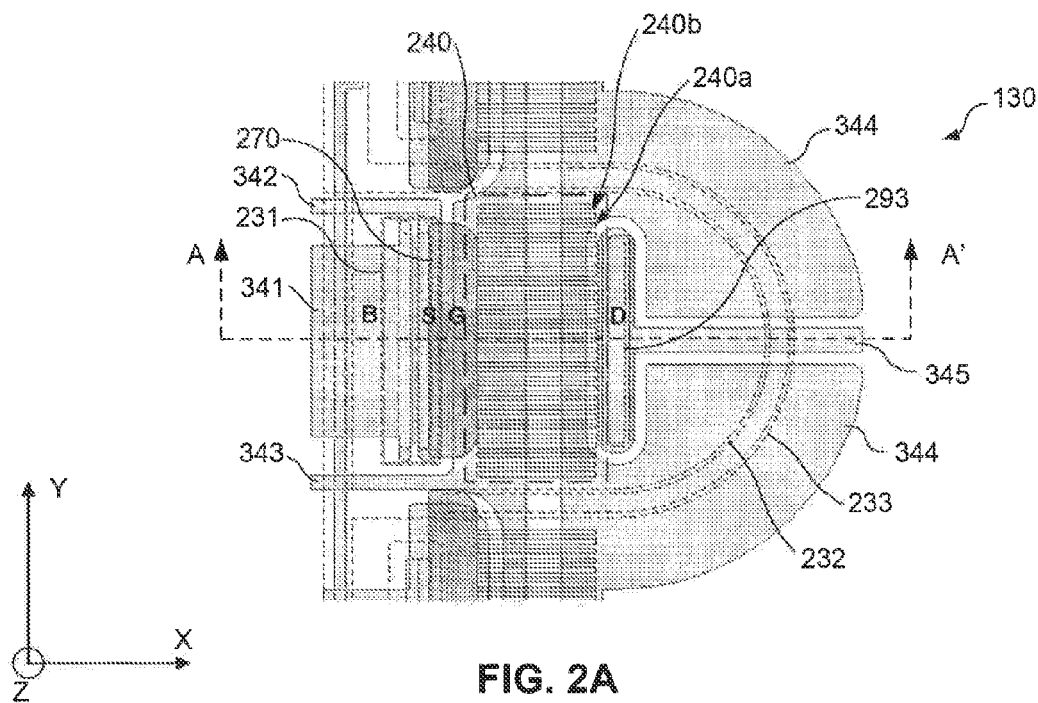
FIG. 2A is a top view of a UHV MOS device according to an embodiment of the present disclosure.
Figure 2B:
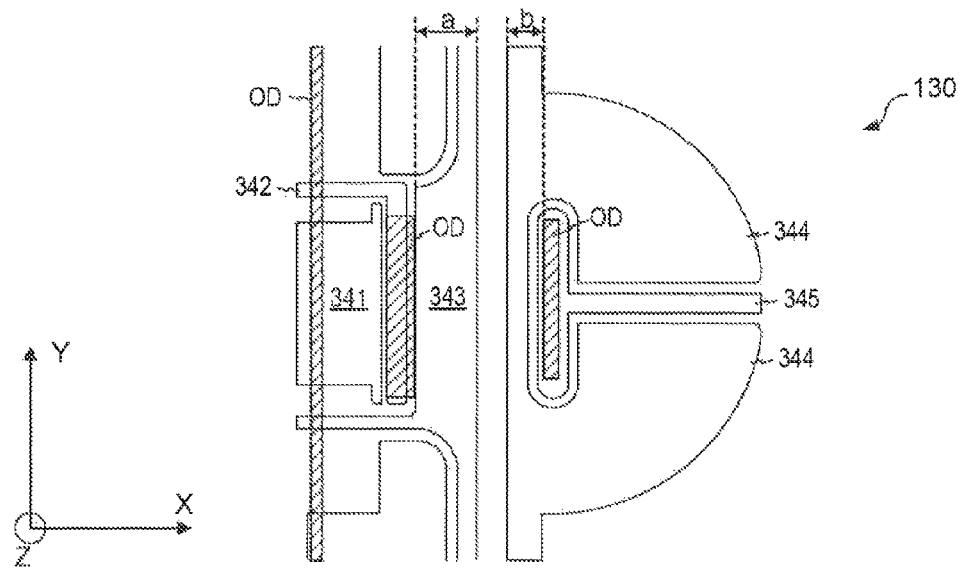
FIG. 2B is another top view of the UHV MOS device of FIG. 2A, illustrating only a metal layer and oxide defined areas where no insulation layer is formed.
Figure 2C:
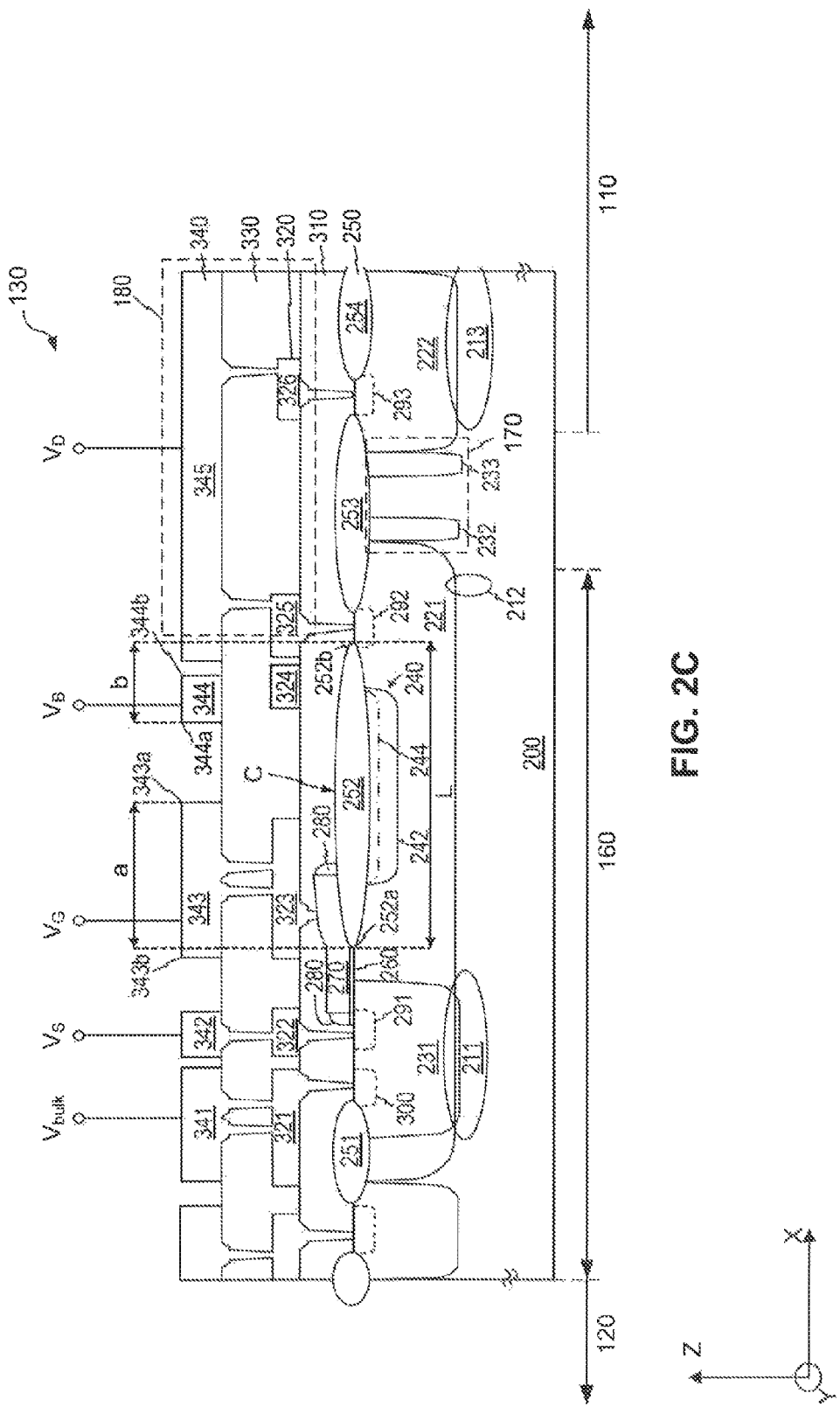
FIG. 2C is a cross-sectional view of the UHV MOS device of FIG. 2A along line A-A'.

FIG. 2A is an enlarged top view of UHV MOS device 130 according to an embodiment. FIG. 2B is another enlarged top view of UHV MOS device 130 of FIG. 2A, illustrating only a metal layer and oxide defined (OD) areas where no insulation layer is formed. FIG. 2C is a cross-sectional view of UHV MOS device 130 along line A-A' of FIG. 2A. Since the structure of UHV MOS device 140 is similar to the structure of UHV MOS device 130, a separate description of the structure of UHV MOS device 140 is not provided.

UHV MOS device 130 is provided on a P-type substrate 200. With reference to FIGS. 2A-2C, HSOR 110 is disposed on a right-side portion of substrate 200, LSOR 120 is disposed on a left-side portion of substrate 200. A UHV MOS region 160 and a self-shielding region 170 are disposed between HSOR 110 and LSOR 120. A high voltage interconnection region 180 is disposed above self-shielding region 170, and overlaps a right-side edge of UHV MOS region 160 and a left-side edge of HSOR 110. HSOR 110 is separated from UHV MOS region 160 by self-shielding region 170 and high voltage interconnection region 180.

Substrate 200 includes a first n-type buried layer (NBL) 211 disposed in UHV MOS region 160, a second NBL 212 disposed in UHV MOS region 160, and a third NBL 213 disposed in HSOR 110. Each one of first through third NBLs 211-213 is doped by an N-type dopant (e.g., arsenic or antimony) at a dopant impurity concentration of about $10^{13}$ to $10^{16}$ atoms/cm$^2$. A first high-voltage N-well (HVNW) 221 is disposed in UHV MOS region 160 of substrate 200. A second HVNW 222 is disposed in HSOR 110 of substrate 200. First HVNW 221 is spaced apart and electrically isolated from second HVNW 222. First and second HVNWs 221 and 222 are doped by an N-type dopant (e.g., phosphorus or arsenic) at a concentration of about $10^{11}$ to $10^{13}$ atoms/cm$^2$. First NBL 211 is connected to a left-side bottom of first NVHW 221. Second NBL 212 is connected to a right-side bottom of first NVHW 221. Third NBL 213 is connected to a bottom of second HVNW 222.

A first P-well (PW) 231 is disposed in first HVNW 221 and extends to connect to first NBL 211 at the bottom of first HVNW 221. A second PW 232 and a third PW 233 are disposed in self-shielding region 170 of substrate 200, between first HVNW 221 and second HVNW 222. First through third PWs 231-233 are doped by a P-type dopant (e.g., boron) at a concentration of about $10^{11}$ to $10^{14}$ atoms/cm$^2$. Second PW 232 is adjacent to a right side of first HVNW 221, and third PW 233 is adjacent to a left side of second HVNW 222. Second PW 232 and third PW 233 are spaced apart from each other to electrically isolate HSOR 110 from LSOR 120. Although UHV MOS device 130 illustrated in FIGS. 2A-2C only includes second PW 232 and third PW 233 to electrically isolate first HVNW 221 from second HVNW 222, UHV MOS device 130 may include more than two PWs disposed between first HVNW 221 and second HVNW 222 to electrically isolate first HVNW 221 from second HVNW 222. In addition, second PW 232 and third PW 233 induce a reduced surface field (RESURF) effect, such that a drift region (described in more detail below) can be fully depleted.

A drift region 240 is disposed in first HVNW 221 and spaced apart from first PW 231. Drift region 240 includes a plurality of first sections 240a and second sections 240b alternately arranged along a channel width direction of UHV MOS device 130 (i.e., Y direction illustrated in FIGS. 2A-2C). Each one of first sections 240a includes a P-top layer 242 and an N-grade layer 244 formed on top of P-top layer 242. Each one of second sections 240b does not include any P-top layer or N-grade layer. P-top layer 242 is doped by a P-type dopant (e.g., boron) at a concentration of about $10^{11}$ to $10^{14}$ atoms/cm$^2$. N-grade layer 244 is doped by an N-type dopant (e.g., phosphorus or arsenic) at a concentration of about $10^{11}$ to $10^{14}$ atoms/cm$^2$. Although FIG. 2C only illustrates the cross-sectional view of one of first sections 240a, the cross-sectional view of second section 240b is similar to that of first section 240a, except that first HVNW 221 forms the entirety of drift region 240 in the cross-sectional view of second section 240b. Drift region 240 functions to drop down operating voltages from a relatively high voltage of higher than 500 V in HSOR 110 to a voltage of 0 V in LSOR 120. As a result, the operating voltages of the devices formed in HSOR 110 are higher than 500 V, and the operating voltages of the devices formed in LSOR 120 are about 0 V.

An insulation layer 250 is disposed over substrate 200. Insulation layer 250 can be formed of field oxide (FOX). Hereinafter, insulation layer 250 is referred to as FOX layer 250. FOX layer 250 includes a first FOX portion 251 covering a left-side edge portion of first HVNW 221 and a left-side edge portion of first PW 231, a second FOX portion 252 covering drift region 240, a third FOX portion 253 covering a right-side edge portion of first HVNW 221, second PW 232, third PW 233, a space between second PW 232 and third PW 233, and a left-side edge portion of second HVNW 222, and a fourth FOX portion 254 covering a right-side portion of second HVNW 222.

A gate oxide layer 260 is disposed over substrate 200, covering a right-side portion of first PW 231, and a space between first PW 231 and second FOX portion 252. A gate layer 270 is disposed over substrate 200, covering gate oxide layer 260 and a left-side portion of second FOX portion 252. Spacers 280 are disposed on side walls of gate layer 270. A first N$^+$-region 291 (hereinafter referred to as "source region 291") is disposed in the right-side portion of first PW 231 adjacent to a left-side edge portion of gate oxide layer 260. A second N$^+$-region 292 (hereinafter referred to as "drain region 292") is disposed in first HVNW 221 between second FOX portion 252 and third FOX portion 253. A third N$^+$-region 293 is disposed in second HVNW 222 between third FOX portion 253 and fourth FOX portion 254. First through third N$^+$-regions 291-293 are doped by a N-type dopant (e.g., phosphorus or arsenic) at a concentration of about $10^{15}$ to $10^{16}$ atoms/cm$^2$. A P$^+$-region 300 (hereinafter referred to as "bulk region 300") is disposed in a left-side portion of first PW 231 adjacent to a right-side edge portion of first FOX portion 251. P$^+$-region 300 is doped by a P-type dopant (e.g., boron) at a concentration of about $10^{15}$ to $10^{16}$ atoms/cm$^2$. Thus, gate layer 270 covers a region between source region 291 and second FOX portion 252, and extends to cover the left-side portion of second FOX portion 252.

An interlayer dielectric (ILD) layer 310 is disposed over substrate 200 and has through holes (so-called "contact") respectively corresponding to bulk region 300, source region 291, gate layer 270, drain region 292, and third N$^+$-region 293. A first metal (M1) layer 320 is disposed over ILD layer 310 and includes first through sixth M1 portions 321-326 electrically isolated from each other. First M1 portion 321 overlaps bulk region 300 and is connected to bulk region 300 via the corresponding through hole in ILD layer 310. Second M1 portion 322 overlaps source region 291 and is connected to source region 291 via the corresponding through hole in ILD layer 310. Third M1 portion 323 overlaps gate layer 270 and second FOX portion 252 and is connected to gate layer 270 via the corresponding through hole in ILD layer 310. Fourth M1 portion 324 overlaps second FOX portion 252 and is connectable to receive a boot voltage $V_{boot}$. Fifth M1 portion 325 overlaps drain region 292 and is connected to drain region 292 via the corresponding through hole in ILD layer 310. Sixth M1 portion 326 overlaps third N$^+$-region 293 and is connected to third N$^+$-region 293 via the corresponding through hole in ILD layer 310. Although not shown in FIGS. 2A-2C, fourth M1 portion 324 can be connected to a resistor or a zener diode formed on substrate 200 to step-down the boot voltage $V_{boot}$ to a lower voltage, and thus provide a voltage difference to be applied to a device (not shown) formed in HSOR 110 and having an operating voltage equal to the voltage difference. For example, if $V_{boot}$ is 500 V, fourth M1 portion 324 can be connected to the resistor or the zener diode to step-down $V_{boot}$ of 500 V to about 485 V, thus providing a voltage difference of 15 V to devices formed in HSOR 110 and having an operation voltage of about 15 V.

An inter-metal dielectric (IMD) layer 330 is disposed over M1 layer 320 and has through holes (so-called "via") respectively corresponding to first through sixth M1 portions 321-326. A second metal (M2) layer 340 is disposed over IMD layer 330 and includes first through fifth M2 portions 341-345. First M2 portion 341 overlaps bulk region 300 and is connected to bulk region 300 via first M1 portion 321 and the corresponding through holes in ILD layer 310 and IMD layer 330. Second M2 portion 342 overlaps source region 291 and is connected to source region 291 via second M1 portion 322 and the corresponding through holes in ILD layer 310 and IMD layer 330. Third M2 portion 343 overlaps gate layer 270 and second FOX portion 252, and is connected to gate layer 270 via third M1 portion 323 and the corresponding through holes in ILD layer 310 and IMD layer 330. Fourth M2 portion 344 overlaps second FOX portion 252 and is connected to fourth M1 portion 324 via a through hole (not shown in FIG. 2C) and boot voltage $V_B$. Fifth M2 portion 345 overlaps drain region 292 and third N$^+$-region 293, and is connected to drain region 292 and third N$^+$-region 293 via fifth M1 portion 325 and sixth M1 portion 326, respectively, and the corresponding through holes in ILD layer 310 and IMD layer 330. Fifth M2 portion 345 is formed in high voltage interconnection region 180, and functions to provide an interconnection between UHV MOS device 130 and the devices formed in HSOR 110.

In operation, a bulk voltage $V_{bulk}$ of about 0 V is applied to first M2 portion 341, a source voltage $V_S$ of about 0 V is applied to second M2 portion 342, a gate voltage $V_G$ is applied to third M2 portion 343, boot voltage $V_B$ is applied to fourth M2 portion 344, and a drain voltage $V_D$ is applied to fifth M2 portion 345. Boot voltage $V_B$ is higher than 500 V, and is higher than or equal to drain voltage $V_D$. Boot voltage $V_B$ is also higher than $V_S$, $V_G$, and $V_{bulk}$.

As illustrated in FIGS. 2B and 2C, second FOX portion 252 includes a left-side edge 252a close to source region 291 and a right-side edge 252b close to drain region 292. Third M2 portion 343 includes an edge 343a located closer to a central portion C of second FOX portion 252 compared to an opposite edge 343b of third M2 portion 343. Fourth M2 portion 344 includes an edge 344a located closer to central portion C of second FOX portion 252 compared to an opposite edge 344b. A distance from edge 343a of third M2 portion 343 to left-side edge 252a of second FOX portion 252 along a channel length direction of UHV MOS device 130, i.e., a direction in which carriers flow (X direction illustrated in FIGS. 2A-2C), is referred to as distance "a". A distance from edge 344a of fourth M2 portion 344 to right-side edge 252b of second FOX portion 252 along the channel length direction is referred to as distance "b". A distance from left-side edge 252a of second FOX portion 252 to right-side edge 252b of second FOX portion 252 along the channel length direction is referred to as distance "L". Distance L may range from 30 μm to 150 μm.

According to an embodiment of the present disclosure, when a ratio of a/L is equal to or higher than 0.46, and a ratio of b/L is equal to or lower than 0.3, UHV MOS device 130 has a relatively high break down voltage, and is reliable in a high temperature environment.

Experiment 1

Breakdown Test

A breakdown test was performed on Samples 1 through 6 that were manufactured to have a structure as illustrated in FIGS. 2A-2C. The dimensions of Samples 1 through 6 were the same except for distances a, b, and L. Table 1 summarizes distances a, b, and L, and ratios a/L and b/L, in Samples 1 through 6.

TABLE 1

| Sample No. | a | b | L | a/L | b/L |
| --- | --- | --- | --- | --- | --- |
| 1 | a1 = 26 μm | b1 = 30 μm | L = 65 μm | a1/L = 0.4 | b1/L = 0.46 |
| 2 | a2 = 30 μm | b1 = 30 μm | L = 65 μm | a2/L = 0.46 | b1/L = 0.46 |
| 3 | a1 = 26 μm | b2 = 25 μm | L = 65 μm | a1/L = 0.4 | b2/L = 0.38 |
| 4 | a2 = 30 μm | b2 = 25 μm | L = 65 μm | a2/L = 0.46 | b2/L = 0.38 |
| 5 | a1 = 26 μm | b3 = 20 μm | L = 65 μm | a1/L = 0.4 | b3/L = 0.3 |
| 6 | a2 = 30 μm | b3 = 20 μm | L = 65 μm | a2/L = 0.46 | b3/L = 0.3 |

During the breakdown test, first M2 portion 341, second M2 portion 342, and third M2 portion 343 were connected to ground, and a voltage that is continuously increased from 0 V was applied to fourth M2 portion 344 and fifth M2 portion 345 until the device broke down (i.e., a drain-source current suddenly increased), to determine the breakdown voltage (BVD) of the device.

Figure 3:
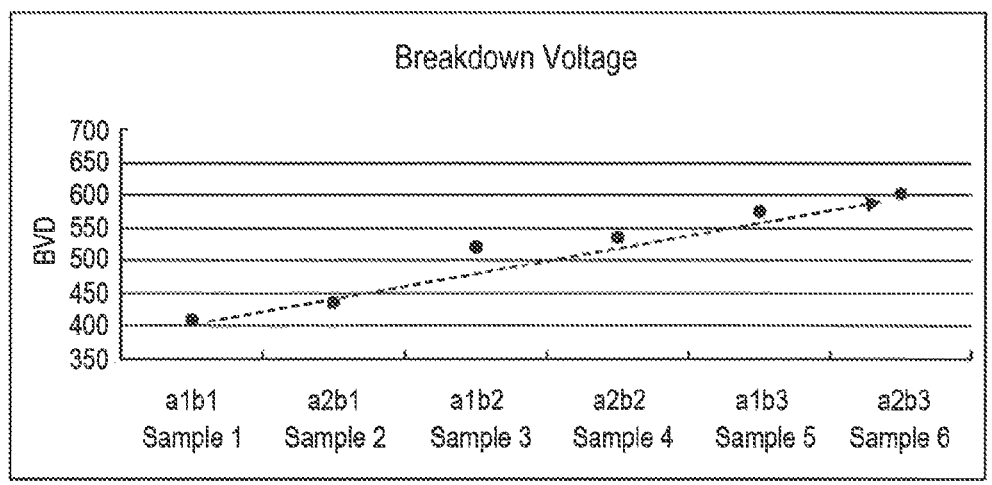
FIG. 3 is a graphical illustration of test results showing breakdown voltages (BVD) of various samples 1 through 6.

FIG. 3 is a graph showing the breakdown voltages (BVDs) of Samples 1 through 6 determined by the breakdown test. According to FIG. 3, Samples 2, 4, and 6 with distance a2 have higher breakdown voltages than those of Samples 1, 3, and 5 with distance a1, respectively. That is, the breakdown voltage increases with increasing distance "a". This is because when distance "a" increases, the right-side edge 343a of third M2 portion 343 extends more closely towards central portion C of second FOX portion 252, and thus a potential distribution between source region 291 and drain region 292 becomes more uniform. As a result, the breakdown voltage increases.

In addition, according to FIG. 3, Samples 5 and 6 with distance b3 have higher breakdown voltages than those of Samples 3 and 4 with distance b2, and Samples 3 and 4 with distance b2 have higher breakdown voltages than those of Samples 1 and 2 with distance b1. That is, the breakdown voltage increases with decreasing distance "b". This is because when distance "b" decreases, the left-side edge 344a of fourth M2 portion 344 extends more closely towards the right-side edge 252b of second FOX portion 252, and thus the potential distribution between source region 291 and drain region 292 becomes more uniform. As a result, the breakdown voltage increases.

Further, according to FIG. 3, Sample 6 with distance a2 and distance b3 has a breakdown voltage of 600 V, which is higher than the breakdown voltages of Samples 1 through 5. In addition, based on an extrapolation indicated by the dotted line of FIG. 3, when distance "a" is larger than a2, and distance "b" is larger than b3, a breakdown voltage higher than 600 V can be achieved. That is, when a device is formed with ratio a/L higher than 0.46, and ratio b/L lower than 0.3, the device can have a breakdown voltage higher than 600 V.

Experiment 2

High Temperature Reverse Bias Test

A high temperature reverse bias (HTRB) test was performed on Samples 11 through 30 that were manufactured to have a structure as illustrated in FIGS. 2A-2C. The HTRB test evaluated the long-term reliability and stability of the samples under high reverse bias, when the samples were turned-off. The dimensions of Samples 11 through 30 are the same except that Samples 11 through 20 have distance "a" of a1=26 µm, and distance "b" of b3=20 µm, and Samples 21 through 30 have distance "a" of a2=30 µm, and distance "b" of b3=20 µm. During the HTRB test, first M2 portion 341 (i.e., bulk terminal), second M2 portion 342 (i.e., source terminal), and third M2 portion 343 (i.e., gate terminal) were connected to ground, and a voltage of 400 V was applied to fourth M2 portion 344 and fifth M2 portion 345 (i.e., drain terminal) for 168 hours in an environment of 150° C. Threshold voltage $V_T$ is the value of the gate-source voltage when the conducting channel just begins to connect the source and drain regions of the transistor, allowing significant current. Threshold voltage $V_T$ was measured for each sample between gate and source terminals when a small voltage (e.g., 0.1 V) is applied to the drain terminal before and after the test. On-state resistance $R_{on}$ was measured for each sample between drain and source terminals when a certain operating voltage (e.g., 15 V) was applied to the gate terminal to ensure the sample transistor was at an on-state condition and to measure the resistance before and after the test. Breakdown voltage BVD was measured between drain and source terminals for each sample after the test when the sample was turned-off.

Table 2 summarizes the test result for Samples 11 through 30.

TABLE 2

| Sample No. | a1, b3 | | | | Sample No. | a2, b3 | | | |
|---|---|---|---|---|---|---|---|---|---|
| | $\Delta V_T$ (%) | $\Delta R_{on}$ (%) | BVD | P/F | | $\Delta V_T$ (%) | $\Delta R_{on}$ (%) | BVD | P/F |
| 11 | −1.42 | 27.42 | 630 | Pass | 21 | −0.72 | 18.41 | 620 | Pass |
| 12 | −0.72 | 28.66 | 650 | Pass | 22 | −0.70 | 19.18 | 620 | Pass |
| 13 | −0.71 | 26.17 | 650 | Pass | 23 | 0.00 | 19.14 | 620 | Pass |
| 14 | −0.72 | 27.19 | 640 | Pass | 24 | −1.43 | 17.23 | 620 | Pass |
| 15 | −0.72 | 30.49 | 660 | Fail | 25 | 0.00 | 18.12 | 620 | Pass |
| 16 | −0.72 | 26.25 | 640 | Pass | 26 | 0.00 | 19.31 | 620 | Pass |
| 17 | −0.72 | 27.32 | 630 | Pass | 27 | 0.00 | 16.58 | 630 | Pass |
| 18 | −0.72 | 27.52 | 640 | Pass | 28 | 0.00 | 17.97 | 620 | Pass |
| 19 | 0.00 | 25.67 | 640 | Pass | 29 | −0.71 | 16.86 | 610 | Pass |
| 20 | −0.72 | 29.08 | 640 | Pass | 30 | 0.00 | 19.65 | 630 | Pass |

In Table 2, $\Delta V_T$ is the shift in $V_T$ measured after the test with respect to that measured before the test. $\Delta R_{on}$ is the shift in $R_{on}$ measured after the test with respect to that measured before the test. The criteria for passing the high temperature reverse bias test is that the BVD measured after the test should be higher than 500 V, and $\Delta R_{on}$ should be less than 30%.

According to Table 2, Samples 21 to 30 with larger distance "a" have a lower $\Delta R_{on}$ compared to Samples 11 to 20 with smaller distance "a". That is, $\Delta R_{on}$ decreases when distance "a" increases. In addition, when distance "a" increases, the device is reliable in the high temperature reverse bias test.

While UHV MOS device 130 in the embodiment described above is provided on a P-type semiconductor substrate, those skilled in the art will now appreciate that the disclosed concepts are also applicable to UHV MOS devices provided on N-type semiconductor substrates, semiconductor on insulator (SOI) substrates, or any other suitable substrates.

While UHV MOS device 130 in the embodiment described above includes two metal layers, i.e., M1 layer 320 and M2 layer 340, those skilled in the art will now appreciate that the disclosed concepts are also applicable to UHV MOS devices including any number of metal layers, e.g., a single metal layer, or three or more metal layers. That is, as long as the uppermost metal layer is formed with ratio a/L equal to or higher than 0.46 and ratio b/L equal to or lower than 0.3, the UHV MOS device can have a relatively high break down voltage, and be reliable in a high temperature reverse biased environment.

While insulation layer 250 of UHV MOS device 130 in the embodiment described above is made of field oxide, insulation layer 250 can be made of other suitable dielectric insulating structures, such as a shallow trench isolation (STI) structure.

While UHV MOS device 130 illustrated in FIGS. 2A-2C has a structure of a lateral drain metal-oxide-semiconductor (LDMOS) device, those skilled in the art will now appreciate that the disclosed concepts are equally applicable to other semiconductor devices such as insulated-gate bipolar transistor (IGBT) devices, and diodes.

While UHV MOS device 130 in the embodiment described above includes first through third NBLs 211-213, those skilled in the art will now appreciate that first through third NBLs 211-213 can be removed by replacing first PW 231 with a shallow P-well.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a substrate;
    a drift region disposed in the substrate;
    an insulation layer disposed over the substrate and covering the drift region, the insulation layer including a first edge and a second edge opposite to the first edge;
    a gate layer disposed over the substrate and covering the first edge of the insulation layer; and
    a metal layer disposed over the substrate and the insulation layer, the metal layer including a metal portion connected to the gate layer and overlapping the first edge of the insulation layer,
    wherein the metal portion includes a first edge located closer to a central portion of the insulation layer than an opposite second edge of the metal portion,
    a distance from the first edge of the metal portion to the first edge of the insulation layer along a channel length direction is a,
    a distance from the first edge of the insulation layer to the second edge of the insulation layer is L, and
    a ratio of a/L is equal to or higher than 0.46.

2. The device of claim 1, wherein the metal portion connected to the gate layer and overlapping the first edge of the insulation layer is a first metal portion,
    the metal layer further includes a second metal portion connectable to receive a boot voltage and overlapping the insulation layer,
    the second metal portion includes a first edge located closer to the central portion of the insulation layer than an opposite second edge of the second metal portion,
    a distance from the first edge of the second metal portion to the second edge of the insulation layer along the channel length direction is b, and
    a ratio of b/L is equal to or lower than 0.3.

3. The device of claim 2, wherein the metal layer further includes a third metal portion electrically connected to a drain region disposed in the substrate, and the third metal portion is connectable to receive a drain voltage different from the boot voltage.

4. The device of claim 1, wherein the distance L ranges from 30 μm to 150 μm.

5. The device of claim 1, wherein the metal layer is a first metal layer, and the device further includes at least one additional metal layer disposed between the substrate and the first metal layer.

6. The device of claim 1, wherein the insulation layer is formed of a field oxide layer.

7. The device of claim 1, wherein the insulation layer is formed in a shallow trench isolation structure.

8. The device of claim 1, wherein the device is a lateral drain metal-oxide-semiconductor (LDMOS) device.

9. The device of claim 1, wherein the device is an insulated-gate bipolar transistor (IGBT) device.

10. The device of claim 1, wherein the device is a diode.

11. The device of claim 1, wherein the substrate is a P-type semiconductor.

12. The device of claim 1, wherein the substrate is an N-type semiconductor.

13. The device of claim 1, wherein the drift region includes a plurality of alternately arranged first sections and second sections,
    each first section includes a top region having a first conductive type and a grade region having a second conductive type, and
    each second section does not include the top region and the grade region.

14. A semiconductor device, comprising:
    a substrate;
    a drift region disposed in the substrate;
    an insulation layer disposed over the substrate and covering the drift region, the insulation layer including a first edge and a second edge opposite to the first edge;
    a gate layer disposed over the substrate and covering the first edge of the insulation layer; and
    a metal layer disposed over the substrate and the insulation layer, the metal layer including a metal portion connectable to receive a boot voltage and overlapping the insulation layer;
    wherein the metal portion includes a first edge located closer to the central portion of the insulation layer than an opposite second edge of the metal portion,
    a distance from the first edge of the metal portion to the second edge of the insulation layer along the channel length direction is b,
    a distance from the first edge of the insulation layer to the second edge of the insulation layer is L, and
    a ratio of b/L is equal to or lower than 0.3.

15. The device of claim 14, wherein the metal portion connectable to receive the boot voltage and overlapping the insulation layer is a first metal portion,
    the metal layer further includes a second metal portion electrically connected to a drain region disposed in the substrate,
    the second metal portion is connectable to receive a drain voltage different from the boot voltage.

16. The device of claim 14, wherein the distance L ranges from 30 μm to 150 μm.

17. The device of claim 14, wherein the metal layer is a first metal layer, and
    the device further includes at least one additional metal layer disposed between the substrate and the first metal layer.

18. An integrated circuit, comprising:
    a substrate including a high side operating region, a low side operating region, and an ultra-high voltage metal-oxide-semiconductor region disposed between the high side operating region and the low side operating region;
    a drift region disposed in the ultra-high voltage metal-oxide-semiconductor region of the substrate;
    an insulation layer disposed over the substrate and covering the drift region, the insulation layer including a first edge and a second edge opposite to the first edge;
    a gate layer disposed over the substrate and covering the first edge of the insulation layer; and
    a metal layer disposed over the substrate and the insulation layer, the metal layer including a metal portion connected to the gate layer and overlapping the first edge of the insulation layer,
    wherein the metal portion includes a first edge located closer to a central portion of the insulation layer than an opposite second edge of the metal portion,
    a distance from the first edge of the metal portion to the first edge of the insulation layer along a channel length direction is a,
    a distance from the first edge of the insulation layer to the second edge of the insulation layer is L, and
    a ratio of a/L is equal to or higher than 0.46.

19. The integrated circuit of claim 18, wherein the metal portion connected to the gate layer and overlapping the first edge of the insulation layer is a first metal portion,
    the metal layer further includes a second metal portion connectable to receive a boot voltage and overlapping the insulation layer,
    the second metal portion includes a first edge located closer to the central portion of the insulation layer than an opposite second edge of the second metal portion,
    a distance from the first edge of the second metal portion to the second edge of the insulation layer along the channel length direction is b, and
    a ratio of b/L is equal to or lower than 0.3.

20. The integrated circuit of claim 19, wherein the metal layer further includes a third metal portion electrically connected to a drain region disposed in the substrate, and
    the third metal portion is connectable to receive a drain voltage different from the boot voltage.

* * * * *